US006754101B2

(12) United States Patent
Terzioglu et al.

(10) Patent No.: US 6,754,101 B2
(45) Date of Patent: Jun. 22, 2004

(54) REFRESH TECHNIQUES FOR MEMORY DATA RETENTION

(75) Inventors: Esin Terzioglu, Aliso Viejo, CA (US); Morteza Cyrus Afghahi, Mission Viejo, CA (US); Gil I. Winograd, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/423,350

(22) Filed: Apr. 25, 2003

(65) Prior Publication Data

US 2003/0218911 A1 Nov. 27, 2003

Related U.S. Application Data

(63) Continuation-in-part of application No. 10/151,981, filed on May 21, 2002.
(60) Provisional application No. 60/445,017, filed on Feb. 4, 2003.

(51) Int. Cl.[7] ........................... G11C 16/04; G11C 16/06
(52) U.S. Cl. ................................. 365/185.02; 365/185.25
(58) Field of Search ................................. 365/201, 203, 365/205, 207, 222, 185.21, 185.25, 185.29

(56) References Cited

U.S. PATENT DOCUMENTS

| 5,157,629 | A | * | 10/1992 | Sato et al. | 365/201 |
| 5,319,253 | A | * | 6/1994 | You | 365/203 |
| 5,748,544 | A | * | 5/1998 | Hashimoto | 365/201 |
| 6,147,916 | A | * | 11/2000 | Ogura | 365/203 |
| 6,459,635 | B1 | * | 10/2002 | Mullarkey et al. | 365/201 |

* cited by examiner

Primary Examiner—Trong Phan
(74) Attorney, Agent, or Firm—McAndrews, Held & Malloy, Ltd.

(57) ABSTRACT

A digital memory system (30) includes a memory cell (52), a bit line (50) and a charge integrity estimating module 35. The module is operative during a first mode of operation to detect whether a quantity of the charge stored in the memory cell lies within the first range of values or the second range of values, is operative during a second mode of operation to detect whether the quantity of the charge lies within a third range of values comprising a subset of the first range of values and is operative during a third mode of operation to detect whether the quantity of the charge lies within a fourth range of values comprising a subset of the second range of values.

18 Claims, 4 Drawing Sheets

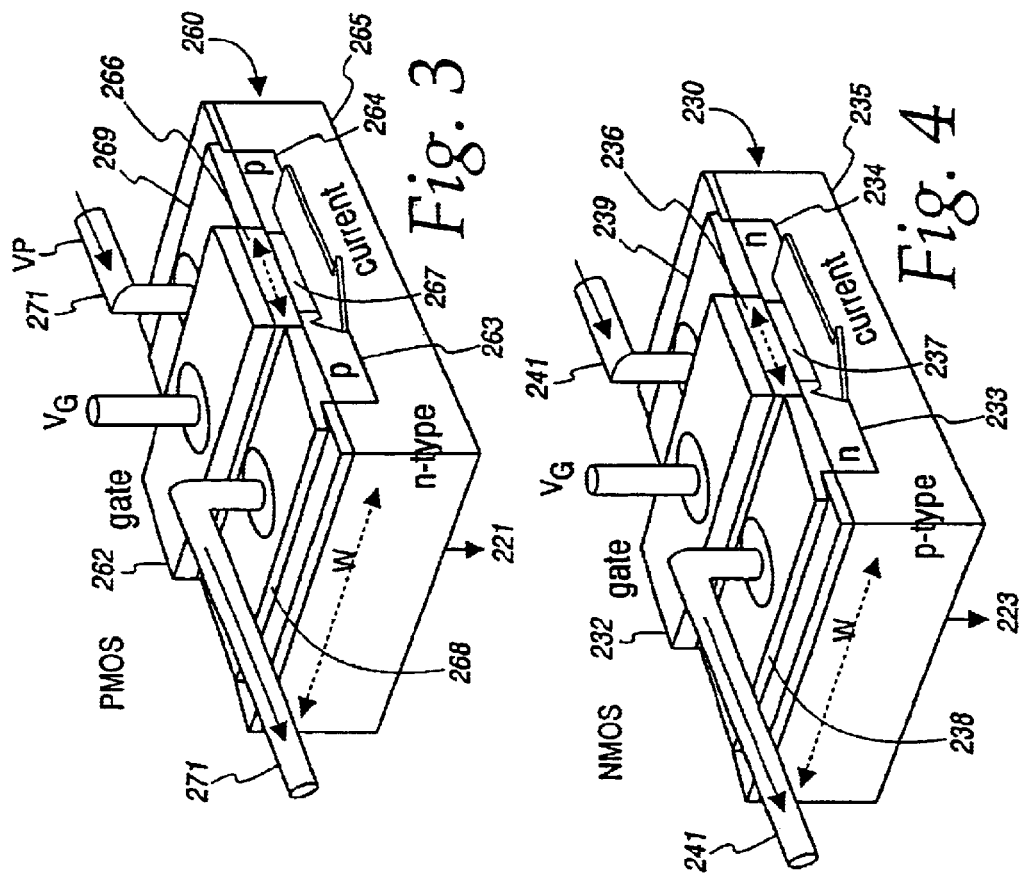
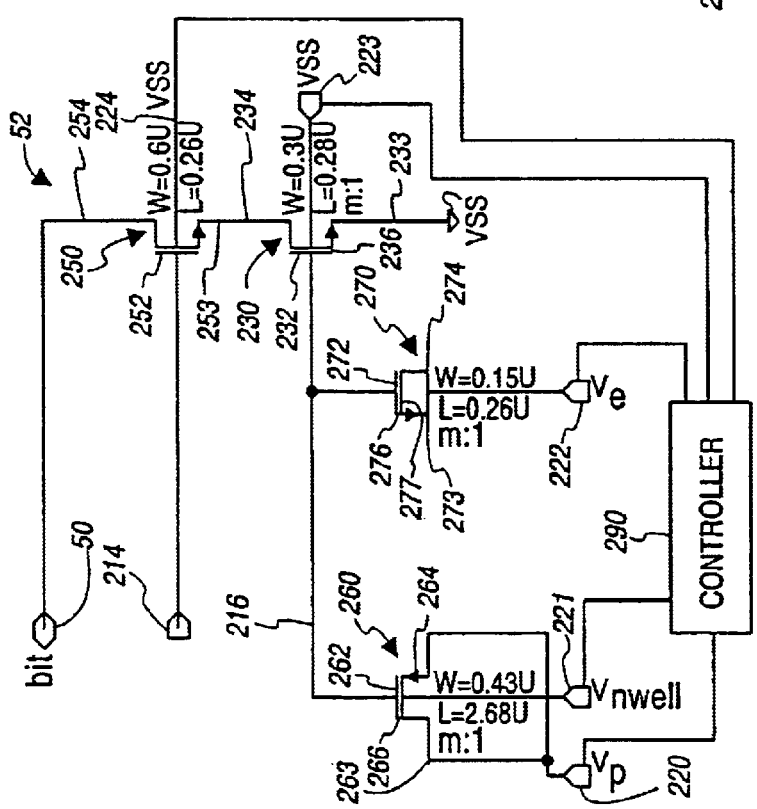

REFRESH TECHNIQUES FOR MEMORY DATA RETENTION

CROSS-REFERENCE TO RELATED APPLICATIONS

This is a continuation-in-part of U.S. application Ser. No. 10/151,981, entitled "Non-Volatile Memory Cell Techniques," filed May 21, 2002 in the names of Meesrs, Terzioglu, Afghahi and Winograd, which is incorporated by reference in its entirety into this application. The applicants claim the benefit of the provisional application No. 60/445,017, entitled "Refresh Techniques For Memory Data Retention" filed Feb. 4, 2003.

BACKGROUND OF THE INVENTION

This invention relates to memory arrays, and more particularly relates to data retention in such memory arrays.

A data retention problem exists in a non-volatile memory array (such as flash, EEPROM etc.) during power-on state. After a cell is programmed or erased, several mechanisms disturb the charge stored on the floating gate. Some of these processes are listed below:

(a) Oxide leakage—oxide leakage occurs even when the power is off and is a function of the amount of charge stored on the floating gate as well as the physical oxide characteristics (such as thickness and structure quality). Oxide leakage is unavoidable and is best addressed by fabrication process techniques.

(b) Read disturb—When power is on and a cell is read from, a current passes through the access transistor. During current flow, energetic electrons and/or holes are generated which can tunnel into the floating gate disturbing the stored data. (When power is off, there is no reading of the cell, and no degradation of the stored data due to reading.)

(c) Neighbor disturb—During erase, program or read operations the neighboring cells which share the word lines, program lines and bit lines with the cell being accessed are also affected through these shared lines. By design, this disturbance is minimized but is not completely eliminated.

(d) Supply noise—When the supply voltages are on, a noise event due to coupling or other current spikes can cause an unexpected voltage drop resulting in data disturbance.

The above noise events one at a time by themselves may not result in data corruption. However, after a long period of continuous operation, failure could result due to the integration of these (small) disturbance events.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

One apparatus embodiment of the invention is useful in a digital memory system including a memory cell arranged to store charge corresponding to first logical value when the quantity of stored charge lies within a first range of values and corresponding to a second logical value when the quantity of stored charges lies within a second range of values. In such an environment, the integrity of the data represented by the charge may be tested by apparatus comprising a bit line coupled to the cell and arranged to conduct charge on the bit line in response the charge stored in the cell and a charge integrity estimating module. The module is operative during a first mode of operation to detect whether the quantity of the charge lies within the first range of values or the second range of values, and is operative during a second mode of operation to detect whether the quantity of the charge lies within a third range of values comprising a subset of the first range of values. The module also is operative during a third mode of operation to detect whether the quantity of the charge lies within a fourth range of values comprising a subset of the second range of values.

One method embodiment of the invention is useful in a digital memory system including a memory cell arranged to store charge corresponding to first logical value when the quantity of stored charge lies within a first range of values and corresponding to a second logical value when the quantity of stored charges lies within a second range of values and also including a bit line coupled to the cell. In such an environment, the integrity of the data represented by the charge may be tested by a method comprising detecting during a first mode of operation whether the quantity of the charge lies within the first range of values or the second range of values and detecting during a second mode of operation whether the quantity of the charge lies within a third range of values comprising a subset of the first range of values. In addition, the method comprises detecting during a third mode of operation whether the quantity of the charge lies within a fourth range of values comprising a subset of the second range of values.

By using the foregoing techniques, a data can be retained in a memory array with a degree of accuracy previously unattained.

These and other advantages and novel features of the present invention, as well as details of an illustrated embodiment thereof, will be more fully understood from the following description and drawings.

BRIEF DESCRIPTION OF THE DRAWING

FIG. 1 illustrates the arrangement of FIGS. 1A and 1B.

FIG. 2 is a schematic diagram of the memory cell shown in FIG. 1A.

FIG. 3 is a schematic diagram of the PMOS transistors shown in FIG. 2.

FIG. 4 is a schematic diagram of the NMOS transistors shown in FIG. 2.

DETAILED DESCRIPTION OF THE INVENTION

Figure 1A:
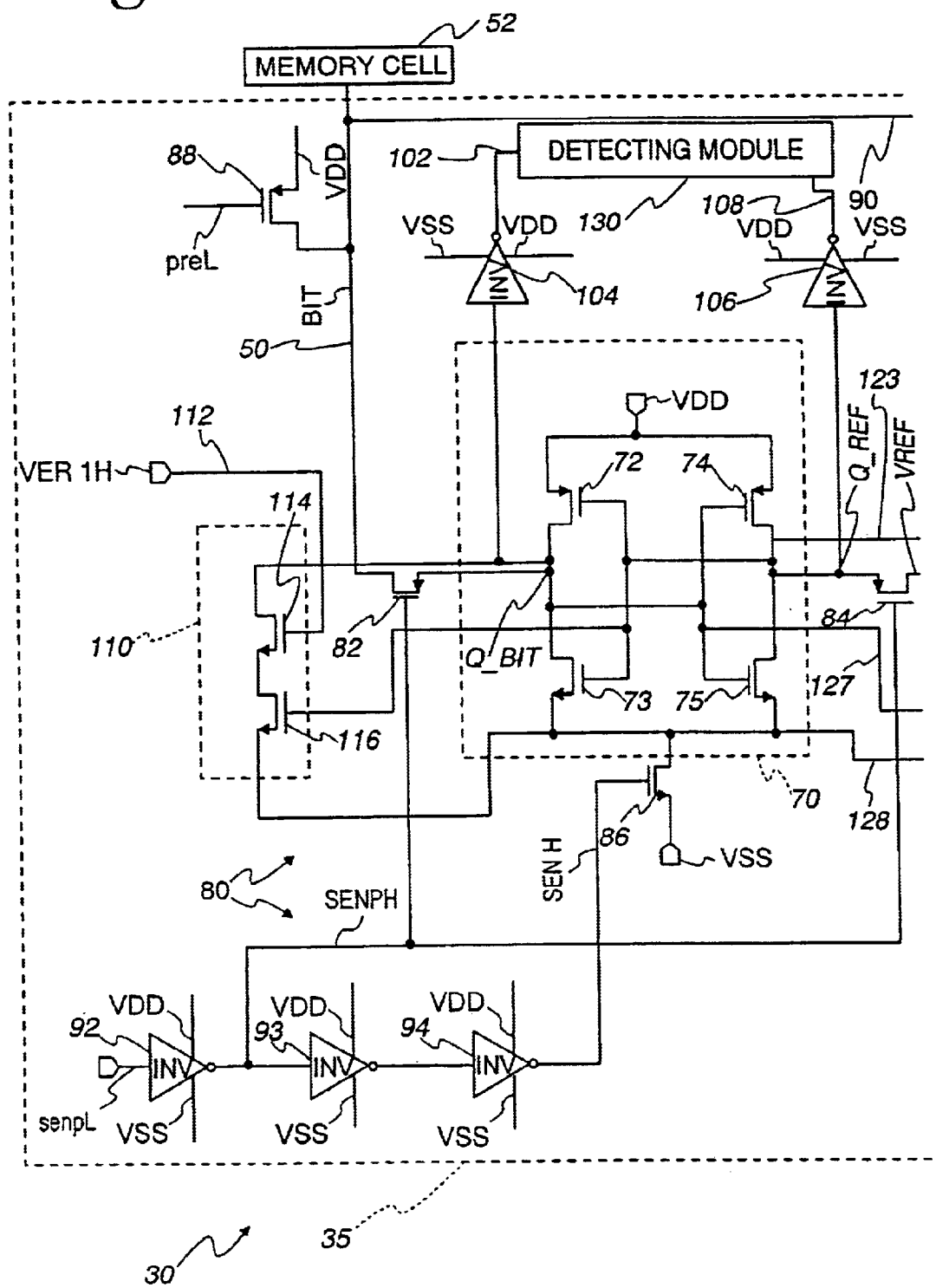
FIGS. 1A and 1B are schematic diagrams of one embodiment of the invention.
Figure 1B:
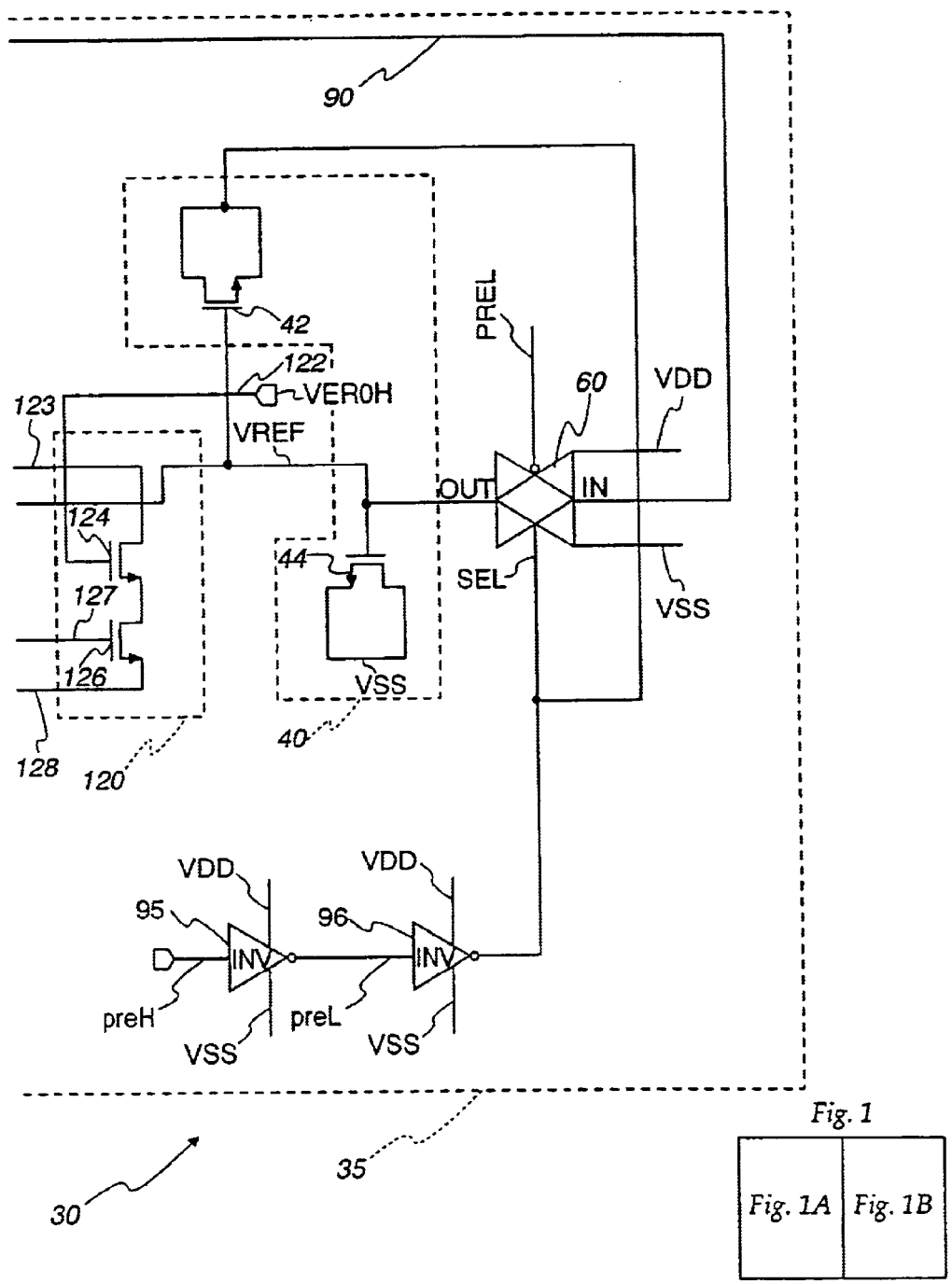

FIG. 1 illustrates a digital memory system 30 including a charge integrity estimating module 35, a bit line 50 and a memory cell 52 that is arranged to store charge corresponding to first logical value when the quantity of stored charge lies within a first range of values and corresponding to a second logical value when the quantity of stored charges lies within a second range of values. For example, the first range of values may correspond to a logical 0 and the second range of values may correspond to a logical 1.

Module 35 includes a single-ended sense amplifier that has a built-in reference voltage generator 40 with noise suppression capability. Single-ended bit line 50 is sampled and held by a transmission gate 60 at the same time the bit line is floated or precharged (in anticipation of the integration time when charge is conducted on the floating bit line in response to charge stored in the cell). If there is noise on the bit line, the sampled reference voltage includes this noise, and it thus becomes common mode (i.e., ignored by differential sense amplifier 70). The sampled voltage stored in transmission gate 60 is then increased for a pull-up sense amplifier (or decreased for a pull-down sense amplifier) by a fixed fraction of the supply voltage by a capacitive divider circuit, such as transistor capacitors 42 and 44, to form a reference voltage. This reference voltage is used by differential pull-down type sense amplifier 70.

Still referring to FIG. 1, transistors 72–75 form a cross-coupled pair of transistors for differential sense amplifier 70.

A control circuit 80 of module 35 includes access transistors 82 and 84 that couple bit line 50 and voltage generator 40 to the internal nodes of sense amplifier 70. When the sense amplifier is energized, transistors 82 and 84 turn off, isolating the internal nodes of amplifier 70. A transistor 86 determines when amplifier 70 is energized by coupling to a supply voltage VDD. A transistor 88 precharges bit line 50 to a supply voltage VDD. Bit line 50 is coupled to the q_bit node of sense amplifier 70 by transistor 82. Bit line 50 also is coupled to transmission gate 60 over a path 90.

Control circuit 80 also includes inverters 92–96. At the moment the precharge transistor 88 is turned off, (when the preL signal becomes VDD), transmission gate 60 also is turned off, thereby isolating bit line 50 from voltage generator 40. At the same time, the source/drain nodes of transistor 42 are pulled low, coupling the Vref node down by a fixed fraction of the supply voltage VDD in order to generate the reference voltage for amplifier 70 on node Vref. The fraction is determined by the relative capacitance of transistor 42 and the node capacitance at node Vref, which includes the capacitance of transistor 44. The node Vref capacitance can be adjusted by changing the size of transistor 44, which is connected to a fixed voltage, such as ground potential or a reference potential VSS.

After reference voltage generator 40 has generated the reference voltage on node Vref, the voltage on bit line 50 is transferred to node q_bit in amplifier 70. The voltage on bit line 50 is generated in response to charge stored in cell 52. The time during which charge is flowing is known as the integration period. At the end of the integration period, the senpL signal is pulled low. As a result, transistors 82 and 84 are turned off after one inverter delay resulting from inverter 92. After two more inverter delays caused by inverters 93–94, sense amplifier 70 is energized when transistor 86 is turned on. After being energized, sense amplifier 70 compares the values at q_ref and q_bit to determine the amount of charge stored in memory cell 52, which determines the logical value stored in cell 52. The value of q_bit is adjusted by the interaction of cell 52 with bit line 50.

According to one embodiments module 35 also includes a transistor stack 110 comprising transistors 114 and 116 that are coupled to transistor pair 72–73 as shown, and a transistor stack 120 comprising transistor 124 and 126 that are coupled to transistor pair 74–75 as shown through conductors 123 and 127–128. Stacks 110 and 120 place a load on sense amplifier 70 when activated. This arrangement cancels the offset of the sense amplifier or introduces a margin in a given direction.

As a result of the foregoing circuitry, amplifier 70 generates an output voltage derived from the charge stored in the memory cell and the reference voltage on a path 102 after being transmitted through an inverter 104. A reference voltage output is transmitted through an inverter 106 to an output path 108. The reference voltage output inverter 106 is used to make the internal sense amplifier loads symmetric. Without inverter 106, the sense amplifier would have a characteristic offset due to load asymmetry.

The embodiment shown in FIG. 1 addresses any disturbance event that is specifically caused during power-on state of the memory array.

Referring to FIG. 2, an exemplary form of memory cell 52 comprises a non-volatile memory cell that is coupled to a bit line 50 and a word line 214. The cell includes a node 216 that comprises a conductive material, such as metal or polysilicon, as well as various sources of reference voltages 220–224.

Referring to FIGS. 2 and 4, an NMOS field effect transistor 230 comprises a gate 232, a source 233, a drain 234, a substrate 235 and an electrically insulating oxide layer 236 that is capacitively coupled between node 216 and a voltage source 222. The source and drain are n type material and the substrate is p type material. The source and drain are separated by a channel region 237. Electrodes 238 and 239 connect the source and drain in a current path 241 that extends from bit line 50 to voltage source 222. Substrate 235 is connected to a voltage source 223. Source 233 is connected to a source of voltage 222.

Another NMOS field effect transistor 250 is constructed like transistor 230. Transistor 250 includes a gate 252 that is connected to word line 214, a drain 254 that is connected to bit line 50 and a source 253 that is connected to drain 234. Source 253 and drain 254 are connected in path 241.

Referring to FIGS. 2 and 3, a PMOS transistor 260 includes a gate 262 connected to node 216, a source 263, a drain 264, a substrate 265 and an electrically insulating oxide layer 266 that is capacitively coupled between node 216 and voltage sources 220–221. The source and drain are p type material and the substrate is n type material. The source and drain are separated by a channel region 267. Electrodes 268 and 269 connect the source and drain in a current path 271. Voltage source 220 is connected to the source and drain, and voltage source 221 is connected to substrate 265.

An NMOS field effect transistor 270 is constructed like transistor 260. Transistor 270 includes a gate 272 that is connected to node 216, and includes a source 273, and a drain 274 that are connected to voltage source 222. A channel region 277 separates the source and drain. An electrically insulating tunneling oxide layer 276 is located under gate 272 and is capacitively coupled between node 216 and voltage source 222. The area of layer 276 is smaller than the area of layer 266. Typically, the area of layer 276 is 5% or less of the area of layer 266. In addition, the surface area of transistor 270 (i.e., the surface area of the source, drain and channel) is smaller than the surface area of transistor 260 (i.e., the surface area of the source, drain and channel). Typically, the surface area of transistor 270 is 5% or less of the surface area of transistor 260.

The sources, drains, channel areas and substrates of each of transistors 230, 250, 260 and 270 are fabricated from semiconductor materials.

For the cells shown in FIG. 2, planar structures are used to couple to the charge storage node 216. Taking advantage of advanced fabrication processes, field assisted tunneling is used to modulate the charge stored on node 216. Beside each of the transistors shown in FIG. 2, the length of the transistor is indicated by L, the width of the transistor is indicated by W, and the multiple of the transistor is indicated by m. The letter U indicates a micron.

Still referring to FIG. 2, node 216 is a floating charge storage node whose potential is varied by modulating the charge stored on node 216. Transistor 260 is a large PMOS device that is used to modify the potential at node 216 by capacitive coupling.

A conventional controller 290 determines the voltage of sources 220–224 during various modes of operation. During an erase operation that removes charge from node 216, electrons are extracted from node 216 by raising terminal 222 to a high voltage. Transistor 270 is small relative to transistor 260, and transistor 270 therefore forms a small portion of the capacitance at node 216 (e.g., the capacitance of node 216 supplied by transistor 270 is much smaller than the capacitance of node 216 supplied by transistor 260). Therefore, most of the applied source 222 voltage is dropped across the oxide layer 276 of transistor 270. Electron extraction from node 216 is achieved when the high positive potential at source 222 attracts electrons from node 216 and causes them to tunnel through oxide layer 276. During an erase operation, controller 290 typically causes the voltages of sources 220–224 to be switched to the following values: Vp, source 220, is approximately 0 volts; Vnwell, source 221, is tied to Vp, source 220; Ve, source 222, is approximately 4 volts; and VSS, nodes 223–224, are approximately 0 volts.

Electrons are injected into floating node 216 during a programming operation by raising terminals 220–221 to a high voltage. Terminals 220–221 can be tied together in a typical cell. Since transistor 260 forms the majority of the capacitance at node 216, only a small amount of the applied source 220–221 voltage is dropped across the oxide layer 266 of transistor 260. In other words, the percentage of source 220–221 voltage dropped across layer 266 is much lower than the percentage of source 222 voltage dropped across layer 276. As a result, due to the operation of transistor 260, the potential of node 216 rises significantly when high voltage is applied from sources 220–221. Since the voltage of source 222 is kept at zero potential during a programming operation, a large potential develops across the oxide layer 276 in the opposite direction of the erase operation. The large voltage across layer 276 attracts electrons into the floating node by a field assisted tunneling mechanism.

Cells like cell 52 typically are organized in an array of cells. For the cells in such a memory array that are not to be programmed, the voltage sources like source 222 are biased to half the source 222 program voltage so as not to cause any disturbance. During a programming operation, controller 290 typically causes the voltages of sources 220–224 to be switched to the following values: Vp, source 220, is approximately 4 volts; Vnwell, source 221, is tied to Vp, source 220; Ve, source 222, is approximately 0 volts; and VSS, nodes 223–224 are approximately 0 volts. If no program is desired for the cell, then Ve, source 222, is approximately 2 volts.

Still referring to FIG. 2, transistors 230 and 250 are used to read data from cell 52. Erase and programming operations require large voltages in the range of 4 volts, and they result in threshold shift and device performance degradation over time. The read operation is accomplished by raising the voltage of word line 214, and the voltages of sources 220–221 to typical chip voltages, such as approximately 1.2 volts in 0.13 micrometer technology. If the potential of node 216 is high enough (e.g., when cell 52 is erased), transistor 230 is switched on. If transistor 250 also is switched on, a current flow in path 241 causes the potential of bit line 50 to decrease. If the potential of node 216 is low (e.g., cell 52 is programmed and net negative charge is present on node 216), transistor 230 is not switched on, and no current flows in path 241 so that the voltage on bit line 50 remains high.

The signals senpH, preH, preL, sel, ver1H and ver0H discussed in connection with FIG. 1 are generated by controller 290 shown in FIG. 2. Thus, controller 290 forms part of charge integrity estimating module 35. The connections of controller 290 to the control signal paths of FIG. 1 have not been shown to avoid unnecessarily complicating FIG. 1.

Memory cell 52 has two verify modes: "verify 0" and "verify 1". "Verify 0" reads a stored word with the sense margin for a "0" (little or no negative charge stored on node 216) decreased by a given amount (designed into the sense amplifier 70). "Verify 1" reads a stored word with the sense margin for a "1" (a range of substantial negative charge stored on node 216) decreased by a given amount. In one embodiment, the shifts in sense margins are achieved by electrically skewing the sense amplifier 70 cross coupled pair 72–75 with stacks 110 and 120. In another embodiment, stacks 110 and 120 are not used. Instead, the shifts in sense margins are achieved by varying the integration time during the first, second and third modes of operation.

First a bit to be verified is read in the normal read mode and the stored data is detected to be a 0 or a 1. If the data disturbance is so severe that there are failures even during the normal read mode, the corruption is unrecoverable. However, the refresh circuits used with most memory arrays continually scan memory cell 52 and fix disturbances so that data corruption is avoided. After the data is read and noted, if the bit is a 0, the bit is verified with the "verify 0" mode. Another read operation is issued to memory cell 52, this time with the "verify 0" mode asserted. The stored bit is now read with a reduced sense margin for 0's. If there are any failures on the expected 0's in the bit, the location is erased more to enforce the weakly stored data.

If the bit is a 1, a "verify 1" cycle is similarly applied to the memory this time with the "verify 1" mode asserted. Any failures during the "verify 1" operation are re-enforced by re-programming the failing bit at the given location. Erase-verify for 0's and program-verify for 1's are repeated until there are no more failures in the normal read and verify read modes for all bits. The effects of power-on disturbances on the non-volatile storage cell are thus eliminated effecting an indefinite retention time as long as the power is on.

The architecture of module 35 allows single word program and erase operations (with the input data determining which bits in the word are to be programmed or erased). During a single-word erase operation, only the bits of the accessed word that correspond to input data 0 are erased. During a single-word program operation, only the bits of the accessed word that correspond to input data 1 are programmed.

Module 35 is continually testing the memory incorporating cell 52 and is verifying each word of the memory. If a word fails a verify operation, that word is erased to fix any failing 0's and is programmed to fix any failing 1's. During the refresh operations, access to the memory is blocked. If this blocking is not desirable, various caching techniques can be used to minimize direct access to the non-volatile memory.

Data verification is accomplished with the following steps:

(i) During a first mode of operation, read the location to be verified (e.g., memory cell 52) in the normal read mode and detect whether the data is a 0 or a 1.

(ii) During a second mode of operation, if a 0 was detected, read the location to be verified (e.g., memory cell 52) with "verify 0" mode asserted.

(iii) Compare the 0's in the data from normal read mode to those in the data from "verify 0" mode.

(iv) If there are any mismatches between the two, erase the 0's in the location and re-verify until all match with 0's from the normal read mode.

(v) During a third mode of operation, if a 1 was detected, read the location to be verified (e.g., memory cell 52) with the "verify 1" mode asserted.

(vi) Compare the 1's in the data from normal read mode to those in the data from "verify 1" mode.

(vii) If there are any mismatches between the two, program the 1's in the location and re-verify until all match with 1's from the normal read mode.

(viii) If refresh erase/program has been performed, apply "verify 0" and "verify 1" after everything has been refreshed to make sure the location is clean.

In the first embodiment, transistor stacks 110 and 120 are added in parallel with the cross coupled sensing nmos pair 72–75. These stacks can be turned on with the ver0H signal (verify 0 mode) and ver1H signal (verify 1 mode). When the verify 0 signal is asserted, sense amplifier 70 is skewed due to the physical size difference in the active cross coupled pair. Similarly, when the verify 1 signal is asserted, the sense amplifier is skewed in the other direction making the margin requirement for sensing a 1 smaller. The end result can be thought of moving the reference voltage (Vref) higher or lower during the verify operations. Instead of a fixed reference value, there is a voltage reference "band" within which no cells can reside (otherwise these cells will be "flagged" during verify operations).

In a second embodiment, stacks 110 and 120 are not used. Instead, the integration time is varied during the first, second and third modes of operation.

Figure 5:
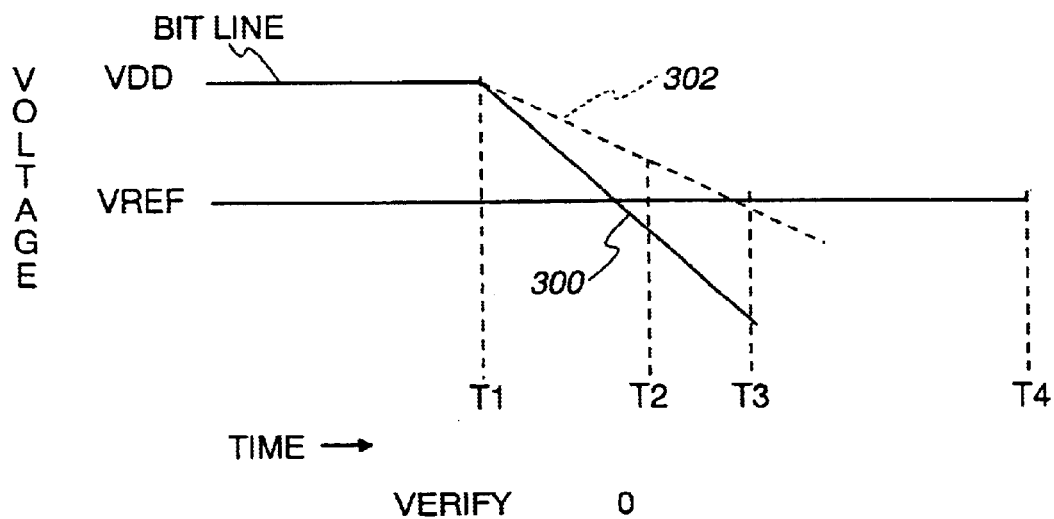
FIG. 5 is a voltage waveform diagram illustrating one embodiment of operation during the verify 0 mode of operation.

The operation for the verify 0 mode of operation is explained with reference to FIG. 5. As previously explained, the verify 0 mode of operation is entered if during the first mode of operation, a read cycle determines that cell 52 stores a 0 (little or no negative charge). The integration time during the read cycle is shown as the time period between times T1 and T3. During the verify 0 mode, prior to time T1, bit line 50 is precharged to VDD, and VREF is generated as previously explained. At time T1, controller 290 causes word line 214 to go high, thereby turning on transistor 252 (FIG. 2). Controller also supplies ground potential to supply 222 at time T1. If node 216 stores no charge, transistor 232 is turned on hard, and the voltage on bit line 50 rapidly decays to values below VREF at both times T2 and T3 as shown by exemplary decay line 300. The bit line voltage is compared with VREF by sense amplifier 70, and the negative relationship can be detected by detecting module 130 at both times T2 and T3.

However, if a small amount of charge is stored on node 216 (but still within the range indicating a 0 value), at time T1, transistor 232 (FIG. 1) will turn on less hard, and the voltage on bit line 50 will follow an exemplary decay line 302. If the bit line voltage were compared with VREF at the end of the read integration time, T3, the bit line voltage would be negative with respect to VREF, thereby giving no indication that some charge had leaked onto node 216. To avoid this result, the bit line voltage is compared with VREF at time T2 during the verify 0 mode of operation. At time T2, the bit line voltage is greater than VREF, thereby indicating that node 216 needs to be erased. In summary, during the verify 0 mode of operation, the integration time of bit line 50 is reduced from time T3 to time T2.

Figure 6:
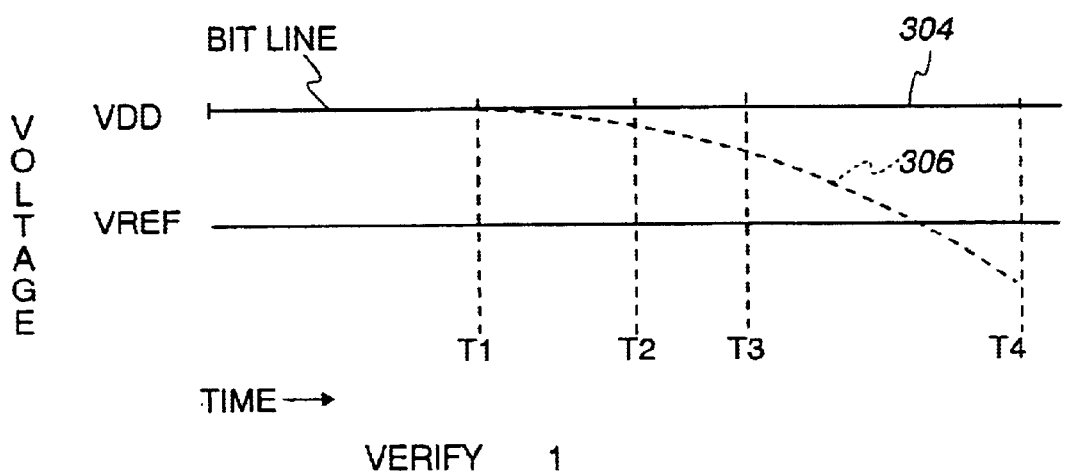
FIG. 6 is a voltage waveform diagram illustrating one embodiment of operation during the verify 1 mode of operation.

The operation for the verify 1 mode of operation is explained with reference to FIG. 6. As previously explained, the verify 1 mode of operation is entered if during the first mode of operation, a read cycle determines that cell 52 stores a 1 (a substantial amount of negative charge). The integration time during the read cycle is shown as the time period between times T1 and T3. During the verify 1 mode, prior to time T1, bit line 50 is precharged to VDD, and VREF is generated as previously explained. At time T1, controller 290 causes word line 214 to go high, thereby turning on transistor 252 (FIG. 2). Controller 290 also supplies ground potential to supply 222 at time T1. If node 216 stores substantial charge, transistor 232 is turned off hard, and the voltage on bit line 50 remains substantially at value VDD at both times T3 and T4 as shown by exemplary decay line 304. The bit line voltage is compared with VREF by sense amplifier 70, and the positive relationship can be detected by detecting module 130 at both times T3 and T4.

However, if some charge has leaked from node 216 (but the amount of charge stored is still within the range indicating a 1 value), at time T1, transistor 232 (FIG. 1) will turn on to some extent, and the voltage on bit line 50 will follow an exemplary decay line 306. If the bit line voltage were compared with VREF at the end of the read integration time, T3, the bit line voltage would be positive with respect to VREF, thereby giving no indication that some charge had leaked from node 216. To avoid this result, the bit line voltage is compared with VREF at time T4. At time T4, the bit line voltage is less than VREF, thereby indicating that node 216 needs to be programmed. In summary, during the verify 1 mode of operation, the integration time of bit line 50 is increased from time T3 to time T4.

The foregoing steps are performed by controller 290 and detecting module 130, and both may be implemented in hardware, software, or a combination of hardware and software.

While the invention has been described with reference to one or more preferred embodiments, those skilled in the art will understand that changes may be made and equivalents may be substituted without departing from the scope of the invention. In addition, many modifications may be made to adapt a particular step, structure, or material to the teachings of the invention without departing from its scope. Therefore, it is intended that the invention not be limited to the particular embodiment disclosed, but that the invention will include all embodiments falling within the scope of the appended claims.

What is claimed is:

1. In a digital memory system including a memory cell arranged to store charge corresponding to first logical value when the quantity of stored charge lies within a first range of values and corresponding to a second logical value when the quantity of stored change lies within a second range of values, apparatus testing the integrity of the data represented by the charge comprising:

a bit line with a voltage responsive to charge stored in the cell; and a charge integrity estimating module operative during a first mode of operation to detect whether the quantity of the charge lies within the first range of values or the second range of values, operative during a second mode of operation to detect whether the quantity of the charge lies within a third range of values comprising a subset of the first range of values and operative during a third mode of operation to detect whether the quantity of the charge lies within a fourth range of values comprising a subset of the second range of values.

2. The apparatus of claim 1 wherein the second mode of operation is entered only if the quantity of charge lies within the first range of values and wherein the third mode of operation is entered only if the quantity of the charge lies within the second range of values.

3. The apparatus of claim 1 wherein the charge integrity estimating module comprises:

a reference voltage generator arranged to generate a reference voltage;

a sense amplifier arranged to generate a sense output voltage in response to the charge conducted by the bit line and the reference voltage;

a first load operative during the second mode of operation to place a first load on the sense amplifier; and a second load operative during the third mode of operation to place a second load on the sense amplifier.

4. The apparatus of claim 3 wherein the reference voltage generator is arranged to precharge the bit line to generate a bit line precharge voltage and arranged to generate the reference voltage in response to the bit line precharge voltage.

5. The apparatus of claim 3 wherein the sense amplifier comprises a differential sense amplifier.

6. The apparatus of claim 1 wherein the estimating module causes the charge to flow in the bit line for variable time periods during the first, second and third modes of operation.

7. The apparatus of claim 6 wherein the first range of values is less than the second range of values.

8. The apparatus of claim 7 wherein the time period during the second mode of operation is shorter than the time period during the first mode of operation.

9. The apparatus of claim 7 wherein the time period during the third mode of operation is longer than the time period during the first mode of operation.

10. In a digital memory system including a memory cell arranged to store charge corresponding to first logical value when the quantity of stored charge lies within a first range of values and corresponding to a second logical value when the quantity of stored charge lies within a second range of values and also including a bit line coupled to the cell, a method of testing the integrity of the data represented by the charge comprising:

detecting during a first mode of operation whether the quantity of the charge lies within the first range of values or the second range of values;

detecting during a second mode of operation whether the quantity of the charge lies within a third range of values comprising a subset of the first range of values; and detecting during a third mode of operation whether the quantity of the charge lies within a fourth range of values comprising a subset of the second range of values.

11. The method of claim 10 wherein the second mode of operation is entered only if the quantity of charge lies within the first range of values and wherein the third mode of operation is entered only if the quantity of the charge lies within the second range of values.

12. The method of claim 10 further comprising:

generating a bit line voltage in response to the charge stored in the memory cell;

generating a reference voltage;

generating a sense output voltage in response to the bit line voltage and the reference voltage;

placing a first load on the bit line during the second mode of operation; and placing a second load on the bit line during the third mode of operation.

13. The method of claim 12 wherein said generating a reference voltage comprises precharging the bit line to generate a bit line precharge voltage and generating the reference voltage in response to the bit line precharge voltage.

14. The method of claim 12 wherein said generating a sense output voltage comprises generating a differential sense output voltage.

15. The method of claim 10 wherein said detecting during a first mode, detecting during a second mode and detecting during a third mode comprises:

generating a bit line voltage in response to the charge stored in the memory cell;

generating a reference voltage; and comparing the bit line voltage and the reference voltage after variable time periods during the first, second and third modes of operation.

16. The method of claim 15 wherein the first range of values is less than the second range of values.

17. The method of claim 16 wherein time period during the second mode of operation is shorter than the time period during the first mode of operation.

18. The method of claim 16 wherein the time period during the third mode of operation is longer than the time period during the first mode of operation.

* * * * *